United States Patent
Bruckmann et al.

(10) Patent No.: US 6,762,705 B2
(45) Date of Patent: Jul. 13, 2004

(54) CONTROLLED DRIVE CIRCUIT FOR AN ANALOG DRIVEN POWER SEMICONDUCTOR

(75) Inventors: Manfred Bruckmann, Nürnberg (DE); Alois Wald, Adelsdorf (DE); Hans-Georg Köpken, Erlangen (DE); Benno Weis, Hemhofen (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 10/386,320

(22) Filed: Mar. 13, 2003

(65) Prior Publication Data

US 2003/0174081 A1 Sep. 18, 2003

(30) Foreign Application Priority Data

Mar. 13, 2002 (DE) .......................................... 102 11 075

(51) Int. Cl.[7] .............................. H03M 1/76; G05F 1/10
(52) U.S. Cl. ......................... 341/148; 341/110; 341/128
(58) Field of Search .................................. 341/144, 148, 341/143, 155, 110, 128

(56) References Cited

U.S. PATENT DOCUMENTS

| 4,618,958 | A | * | 10/1986 | Shibata et al. | .......... 372/29.014 |
| 5,652,542 | A | * | 7/1997 | Fink | ................................ 330/2 |
| 6,191,715 | B1 | * | 2/2001 | Fowers | ........................ 341/120 |
| 6,624,772 | B1 | * | 9/2003 | Gealow et al. | ............. 341/120 |

* cited by examiner

Primary Examiner—Peguy JeanPierre
(74) Attorney, Agent, or Firm—Henry M. Feiereisen

(57) ABSTRACT

A controlled drive circuit for an analog controlled power semiconductor includes a digitally operating logic module, which has a control input receiving control signals from an A/D converter and a control output supplying processed control signals to a D/A module that converts the processed digital control signals signal to an analog or quasi-analog control variable that controls the power semiconductor.

9 Claims, 1 Drawing Sheet

CONTROLLED DRIVE CIRCUIT FOR AN ANALOG DRIVEN POWER SEMICONDUCTOR

CROSS-REFERENCES TO RELATED APPLICATIONS

This application claims the priority of German Patent Application, Serial No. 102 11 075.1, filed Mar. 13, 2002, pursuant to 35 U.S.C. 119(a)–(d), the disclosure of which is incorporated herein by reference.

BACKGROUND OF THE INVENTION

The present invention relates to a controlled drive circuit for an analog controlled power semiconductor.

Power semiconductors require for their operation a drive circuit which provides a voltage or a current at the control input of the power semiconductor. For different reasons, an analog-controllable voltage or a voltage-controlled current is advantageously applied to the control input of the power semiconductor, i.e., a control variable that can assume any value within the range of the supply voltage. The control variable can be arranged to depend on different status data of the power semiconductor, for example on the collector-emitter voltage, the collector current or the temperature of the power semiconductor. One or several of these status data can be fed back to the control circuit which then controls the control variable accordingly.

The drive circuit has typically the following architecture:

A control signal, generated for example by a microcontroller, is transmitted via a voltage interface to the input of a drive logic. The output of the logic device, i.e. the drive logic, is connected to module for forming and amplifying a signal, where the control signal is processed so as to be capable to suitably drive the power semiconductor.

The status data of the power semiconductor can be fed back to the drive logic and to the module that forms and amplifies the signal, thereby adjusting these modules. While feed-back of the status data to the logic module is only capable of switching the power semiconductor off, for example to prevent an undesirable or unacceptable operating state, and/or of preventing the power semiconductor from switching back on after the event that caused it to switch off, feedback of the status data to the analog module that forms and amplifies the signal adjusts the analog control signal at the input of the power semiconductor so as to counteract the measured status data. With a drive circuit configured in this manner, the module that forms and amplifies the signal can disadvantageously only generate a limited wave form at the input of the power semiconductor, thus limiting the drive circuit to a specified type of power semiconductor. For example, if another type of power semiconductor or another family of power semiconductors is to be employed, then the entire analog switching module has to be modified. Moreover, the feedback to the analog switching module or to the input of the analog switching component has to be adapted to the feedback for that component. This limits the design options and makes the circuit more complex.

It would therefore be desirable and advantageous to provide an improved drive circuit which obviates prior art shortcomings and which is simple in design and universally applicable.

SUMMARY OF THE INVENTION

According to one aspect of the present invention, a controlled drive circuit for an analog controlled power semiconductor includes an A/D converter, a digitally operating logic module having a control input and a control output, with the control input receiving digital control signals from the A/D converter and supplying processed digital control signals to the control output, and a D/A module receiving the processed digital control signals from the control output and converting the received processed digital control signals signal to an analog or quasi-analog control variable that controls the power semiconductor.

The term power semiconductor is to be understood as including controllable semiconductors, such as transistors, field-effect transistors (FET), Insulated-Gate Bipolar Transistors (IGBT), switchable thyristors and the like. The power semiconductors can be packaged in a module, and a module can include more than one power semiconductor, which can be different, for example, a bridge-arm module. A separate drive circuit may be required for each power semiconductor of a module.

A feedback signal converted to a digital signal affects the logic module, which generates a control variable for the control voltage of the power semiconductor. This control variable has an arbitrary bit width (greater than 1 bit) and is applied to an electronic component or module which converts the digital control signals produced in the logic module into an analog or quasi-analog control variable for the power semiconductor.

According to an advantageous feature of the invention, the module that converts the control signal can be implemented as a D/A converter, with the output of the D/A converter being connected to an in put of an amplifier. Feedback signals concerning the status of the power semiconductor then no longer operate on the analog circuit section of the drive circuit which normally would influence the control variable in an analog fashion. The feedback signals are transmitted to the logic module via an A/D converter with an arbitrary bit width (greater than 1 bit), with the logic module making corrections and forming the control variable.

According to another feature of the present invention, the amplifier can be an operational amplifier, preferably a operational amplifier that can be controlled.

According to yet another feature of the present invention, the analog value of the D/A converter may be transmitted to the control input of the power semiconductor via a wideband power amplifier. Alternatively or in addition, a voltage-controlled current source can be connected after the D/A converter.

According to another feature of the present invention, the D/A converter can be implemented as a conventional IC (DAC-IC) adapted for D/A conversion or as a conventional discrete circuit. The D/A converter can also be implemented as a control unit that supplies the control variable directly to the power semiconductor.

According to another feature of the present invention, the amplifier can be implemented as a wideband operational amplifier. Alternatively, a conventional discrete circuit can be employed which can include a voltage-controlled current source or a voltage converter. If the D/A converter has sufficient output power, then the amplifier may be eliminated.

Likewise, a conventional IC (ADC-IC) adapted for A/D conversion can be used for A/D conversion. Alternatively, a discrete circuit can be employed for converting the total value into a digital signal with a bit width of greater than 1 bit. A separate circuit can be used for the A/D conversion of each individual status feedback signal; alternatively, a single A/D converter can be used to process more than one status feedback signal, for example by applying the various status feedback signals time-sequentially (time-multiplexed) to the input of the A/D converter.

According to another feature of the present invention, the logic module can be implemented as a discrete logic circuit or a programmable (volatile or non-volatile) logic module. The logic module can also be implemented as or integrated in an integrated circuit, such as a specifically adapted IC (ASIC). In addition, the D/A and A/D conversion functionality, optionally also the amplification functionality, can be integrated in the IC (ASIC). A control algorithm for controlling the power control element of the power semiconductor can be stored in the logic module, whereby the logic module can be implemented as a microprocessor.

The module for converting the digital control signal produced in the logic module into an analog or quasi-analog control variable for the power semiconductor can be implemented with other methods in addition to D/A conversion followed by amplification. For example, the D/A converter can supply a value that can operate as a setpoint for an analog control circuit cooperating with the amplifier. This analog control circuit can supply the voltage to the gate of the power semiconductor. The control function can also be implemented digitally via the logic module, in which case the D/A converter can be eliminated. With this arrangement, the gate voltage can be measured and transmitted to the logic module via an A/D converter. The logic module can then supply the signal to the amplifier to increase or decrease the gate voltage.

The control signal for the power semiconductor can also be provided in a quasi-analog fashion by generating the control signal from a digital signal having a suitable voltage. The digital signal can be provided, for example, by a sigma-delta modulator, by pulse width modulation or by a digital controller. This voltage subsequently passes through a low-pass filter which in the simplest situation includes a resistor and the gate capacitance. Higher order filters, which may include resistors, capacitors and coils (inductors), can also be used.

BRIEF DESCRIPTION OF THE DRAWING

Other features and advantages of the present invention will be more readily apparent upon reading the following description of currently preferred exemplified embodiments of the invention with reference to the accompanying drawing, in which the sole

DETAILED DESCRIPTION OF PREFERRED EMBODIMENTS

Figure 1:
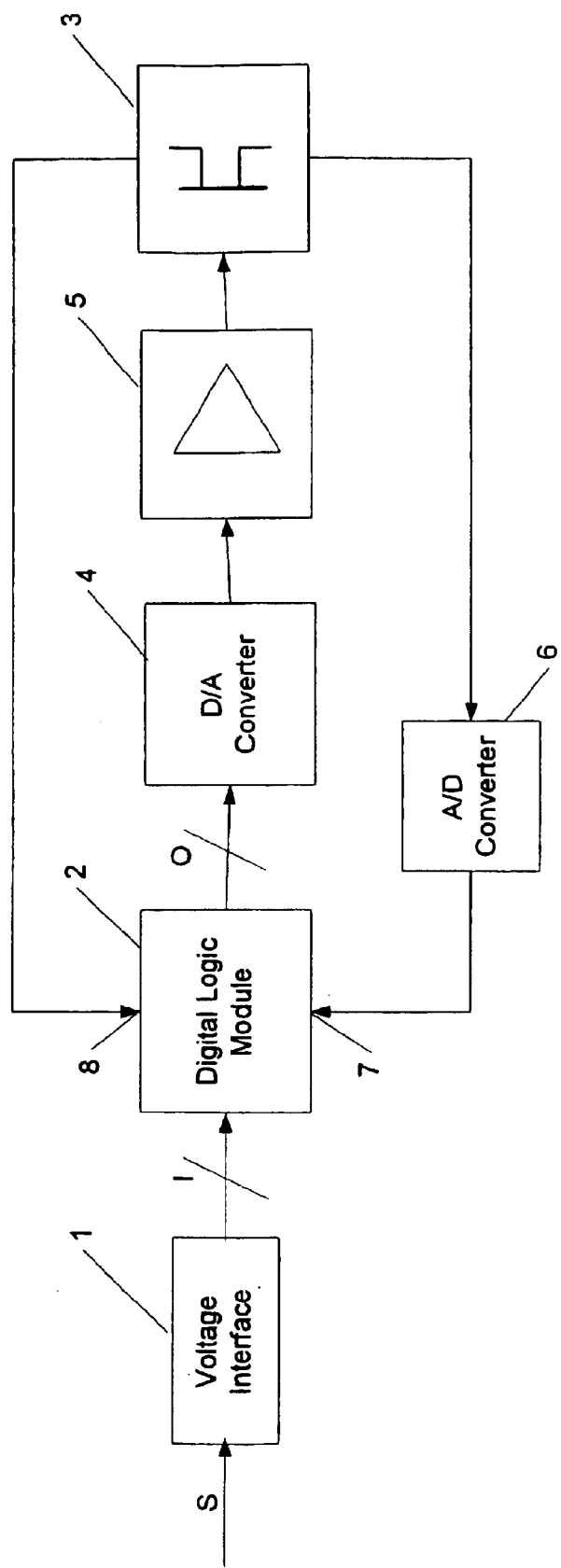
FIG. 1 shows a schematic circuit diagram of the architecture of a drive circuit according to the invention.

These depicted embodiments are to be understood as illustrative of the invention and not as limiting in any way.

Turning now to the only FIG. 1, there is shown a schematic circuit diagram of the architecture of a drive circuit for an analog controlled power semiconductor according to the invention. The drive circuit includes a voltage interface 1 receiving a control signal S and transmitting the control signal S to an input interface I of a digital logic module 2. The digital logic module 2 forms from the control signal S a digital signal to be processed into a control variable that controls a power semiconductor 3. The output of the logic module 2 is connected via an output interface O to a D/A converter 4 and an amplifier 5. The amplifier 5 is connected to the gate of the power semiconductor 3. Status data are returned from the power semiconductor 3 via an A/D converter 6 to an input 7 of the logic module 2. Optionally, additional status feedback signals can be returned directly in a conventional manner digitally to an additional input 8 of the logic module 2. These signals can be used, for example, to inhibit the driver of the power semiconductor 3 without delay.

A digital representation of the analog value of the control voltage at the gate of the power semiconductor 3 is formed in the logic module 2, when the status data of the power semiconductor 3 are returned via the A/D converter 6 to the logic module 2. This digital value represents the analog value of the control voltage applied to the gate of the power semiconductor 3 after D/A conversion in the D/A converter 4 and amplification in amplifier 5.

While the invention has been illustrated and described in connection with currently preferred embodiments shown and described in detail, it is not intended to be limited to the details shown since various modifications and structural changes may be made without departing in any way from the spirit of the present invention. The embodiments were chosen and described in order to best explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and their equivalents:

What is claimed is:

1. A controlled drive circuit for an analog controlled power semiconductor, comprising:
   an A/D converter,
   a digitally operating logic module having a control input and a control output, with the control input receiving digital control signals from the A/D converter and supplying processed digital control signals to the control output, and
   a D/A converter connected in series with an amplifier, said D/A converter receiving the processed digital control signals from the control output and converting the received processed digital control signals signal to an analog control variable that controls the power semiconductor.

2. The circuit of claim 1, wherein the amplifier is an operational amplifier.

3. The circuit of claim 1, wherein the amplifier is controlled.

4. The circuit of claim 1, wherein the amplifier is implemented as a voltage-controlled current source.

5. The circuit of claim 1, wherein the amplifier is integrated with the D/A converter.

6. The circuit of claim 1, wherein the logic module is implemented as an integrated circuit.

7. The circuit of claim 6, wherein at least one electronic component selected from the group of D/A converter, amplifier and A/D converter is integrated in the integrated circuit.

8. The circuit of claim 1, wherein the logic module is implemented as a microprocessor.

9. The circuit of claim 1, wherein a control algorithm for the drive circuit of the power semiconductor is stored in the logic module.

* * * * *